(12) United States Patent
Lou et al.

(10) Patent No.: US 11,645,966 B2
(45) Date of Patent: May 9, 2023

(54) DISPLAY PANEL AND DISPLAY DEVICE (71) Applicant: KunShan Go-Visionox Opto-Electronics Co., Ltd, Jiangsu (CN)

(72) Inventors: Junhui Lou, Kunshan (CN); Yanan Ji, Kunshan (CN)

(73) Assignee: KunShan Go-Visionox Opto-Electronics Co., Ltd, Kunshan (CN)

(*) Notice: Subject to any disclaimer, the term of this patent is extended or adjusted under 35 U.S.C. 154(b) by 92 days.

(21) Appl. No.: 17/500,132

(22) Filed: Oct. 13, 2021

(65) Prior Publication Data

US 2022/0036795 A1 Feb. 3, 2022

Related U.S. Application Data (63) Continuation of application No. PCT/CN2020/102697, filed on Jul. 17, 2020.

(30) Foreign Application Priority Data

Oct. 29, 2019 (CN) .......................... 201911038962.5

(51) Int. Cl.
G09G 3/20 (2006.01)

(52) U.S. Cl.
CPC ......... *G09G 3/2074* (2013.01); *H10K 59/122* (2023.02); *H10K 59/123* (2023.02); *H10K 59/128* (2023.02); *H10K 59/35* (2023.02)

(58) Field of Classification Search
CPC ............................ G09G 3/2074; H10K 59/122
See application file for complete search history.

(56) References Cited

U.S. PATENT DOCUMENTS

| 4,920,409 A | 4/1990 | Yamagishi |
| 9,543,364 B2 * | 1/2017 | Rappoport ............ G06F 1/1686 |

(Continued)

FOREIGN PATENT DOCUMENTS

| CN | 106856204 A | 6/2017 |
| CN | 109192076 A | 1/2019 |

(Continued)

OTHER PUBLICATIONS

Extended European Search Report dated Dec. 14, 2022, in corresponding European Application No. 20881840, 9 pages.

(Continued)

*Primary Examiner* — Kevin M Nguyen
(74) *Attorney, Agent, or Firm* — Maier & Maier, PLLC (57) ABSTRACT

A display panel and a display device. The display panel has a first display area and a second display area. The first display area includes a central region and an edge region adjacent to the central region. The first display area has a light transmittance greater than that of the second display area. The display panel includes a plurality of repetitive units, each of which includes at least two pixels, each pixel including a plurality of sub-pixels in at least three colors. Each of the sub-pixels includes a first electrode, a light-emitting structure, and a second electrode stacked in sequence. In the first display area, the first electrodes of adjacent sub-pixels of an identical color in the repetitive unit are electrically connected via an interconnection structure in order to form at least three pixel groups and each of the pixel groups is in a same color.

20 Claims, 4 Drawing Sheets

(56) References Cited

U.S. PATENT DOCUMENTS

| | | | | |
|---|---|---|---|---|
| 10,868,089 B2* | 12/2020 | Oh | ................... | H10K 50/8428 |
| 2019/0319212 A1* | 10/2019 | Park | ..................... | H10K 59/88 |
| 2020/0236259 A1* | 7/2020 | Nakamura | ............ | H10K 59/65 |

FOREIGN PATENT DOCUMENTS

| | | | |
|---|---|---|---|
| CN | 109584794 | A | 4/2019 |
| CN | 209071333 | U | 7/2019 |
| CN | 110189639 | A | 8/2019 |
| CN | 110288945 | A | 9/2019 |
| CN | 110379836 | A | 10/2019 |
| CN | 110767720 | A | 2/2020 |
| CN | 110783386 | A | 2/2020 |
| CN | 110890026 | A | 3/2020 |
| CN | 210516000 | U | 5/2020 |
| CN | 210516181 | U | 5/2020 |
| EP | 4036979 | A1 | 8/2022 |
| TW | 201839745 | A | 11/2018 |

OTHER PUBLICATIONS

The International search report for PCT Application No. PCT/CN2020/102697, dated Sep. 24, 2020, 7 pages.

The Office Action for Chinese Application No. 201911038962.5, dated Sep. 25, 2020, 10 pages.

The Office Action for Taiwanese Application No. 109125182, dated Jul. 22, 2021, 8 pages.

Office Action dated Dec. 6, 2022, in corresponding Japanese Application No. 2021-566231, 5 pages.

* cited by examiner

DISPLAY PANEL AND DISPLAY DEVICE

CROSS REFERENCE TO RELATED APPLICATION

The application is a continuation of International Application No. PCT/CN2020/102697 filed on Jul. 17, 2020, which claims the priority benefits of Chinese Patent Application No. 201911038962.5 filed on Oct. 29, 2019 and entitled "DYSPLAY PANEL AND DYSPLAY DEVICE", both of which are incorporated herein by reference in their entireties.

TECHNICAL FIELD

The application relates to the field of display, and in particular to a display panel and a display device.

BACKGROUND

With the rapid development of electronic devices, users have a higher and higher requirement on the screen-to-body ratio, such that the full-screen display of electronic devices has attracted more and more attention in the industry.

The electronic devices such as cellphones, tablet computers and the like need to be integrated with front-facing cameras, earpieces, and infrared sensing elements and the like. In the prior arts, it is possible to provide a notch or an opening in the display screen, through which external light can enter the photosensitive element underneath the screen. However, all of these electronic devices are not full screens in the true sense, and cannot display on each region of the entire screen, for example, the region corresponding to the front-facing camera cannot display a picture.

SUMMARY

A first aspect of the application provides a display panel having a first display area and a second display area, the first display area comprising a central region and an edge region adjacent to the central region, the first display area having a light transmittance greater than that of the second display area, the display panel comprising:

a plurality of repetitive units, each of which comprises at least two pixels, each of the pixels comprising a plurality of sub-pixels in at least three colors, each of the sub-pixels comprising a first electrode, a light-emitting structure and a second electrode stacked in sequence;

in the first display area, the first electrodes of adjacent sub-pixels of an identical color in the repetitive unit are electrically connected via an interconnection structure in order to form at least three pixel groups and each of the at least three pixel groups is in a same color.

According to any implementation of the first aspect of the application, in the central region, the interconnection structure of at least one of the at least three pixel groups of one color is a transparent conductive structure.

In the display panel according to an embodiment of the application, the first display area has a light transmittance greater than that of the second display area, such that the display panel can be integrated with a photosensitive component on the back side of the first display area to achieve under-screen integration of a photosensitive component such as a camera while the first display area can display a picture, thereby improving the display area of the display panel and realizing the full-screen design of a display device.

In the display panel according to an embodiment of the application, the first electrodes of adjacent sub-pixels of an identical color in the repetitive unit within the first display area are electrically connected via an interconnection structure in order to form a pixel group. As such, the plurality of pixels comprised in the repetitive unit within the first display area become one pixel, such that the actual pixel density (Pixels Per Inch, PPI) of the first display area can be reduced, where the sub-pixels of the pixel group in the repetitive unit only need to be connected to one pixel circuit, so as to reduce the number of wirings in the first display area, and facilitate to improve the light transmittance of the first display area.

In the central region, the interconnection structure of at least one of the three pixel groups of one color is a transparent conductive structure, which can further improve the light transmittance in the central region of the first display area.

BRIEF DESCRIPTION OF THE DRAWINGS

Other features, objects and advantages of the application will become more apparent upon reading the following detailed description of non-limiting embodiments with reference to the accompanying drawings, in which the same or similar reference numerals refer to identical or similar features. The drawings are not drawn to actual scale.

DETAILED DESCRIPTION

The features and embodiments of the application in various aspects will be described in detail below. For clearly understanding of the purpose, technical solution and advantages of the application, the application will be described in further details in combination with the drawings and specific embodiments. It should be noted that the specific embodiments described herein are intended only to explain the application rather than to limit it. A person skilled in the art may implement the application without some of these specific details. The following description of the embodiments is for the purpose of better understanding of the application through showing examples of the application.

On electronic devices such as cellphones, tablet computers and the like, it is necessary to integrate a photosensitive component such as a front camera, an infrared light sensor, a proximity light sensor or the like on a side of a display panel. In some embodiments, a light-transmissive display area may be provided on the aforesaid electronic device, and the photosensitive component is arranged on the back side of the light-transmissive display area, so as to achieve full-screen display of the electronic device while ensuring normal operation of the photosensitive component.

In order to improve the light transmittance of the light-transmissive display area and facilitate the arrangement of the pixel drive circuit of the sub-pixels in the light-transmissive display area, it is often necessary to combine the sub-pixels within the light-transmissive display area. However, there is a problem in that the light transmittance of the light-transmissive display area is not high in the light-transmissive display area in the sub-pixel combination method.

In order to solve the above problem, embodiments of the application provide a display panel and a display device, and various embodiments of the display panel and the display device will be described below with reference to the accompanying drawings.

Embodiments of the application provide a display panel, which may be an organic light-emitting diode (OLED) display panel.

Figure 1:
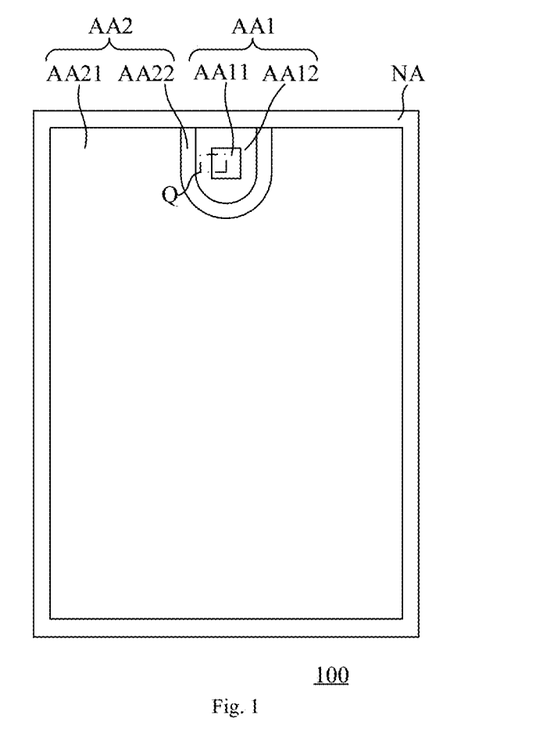
FIG. 1 shows a schematic top view of a display panel according to an embodiment of the application.
Figure 2:
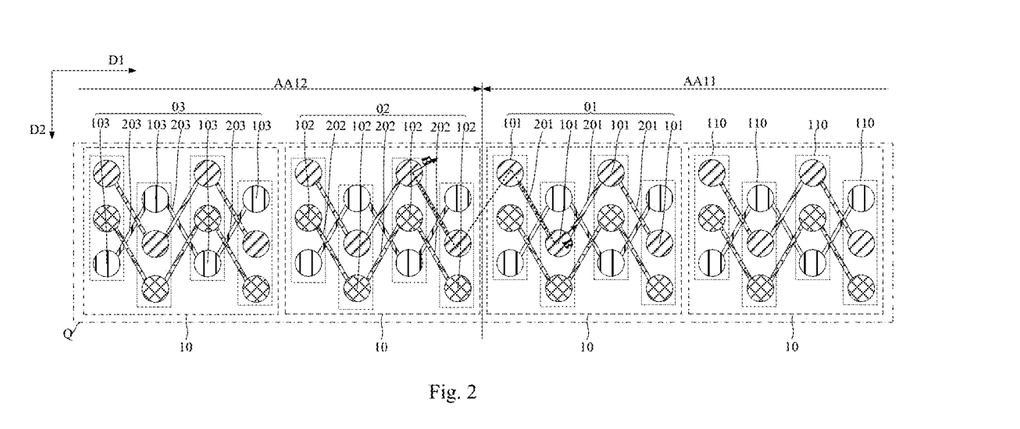
FIG. 2 shows a partial enlarged view of the region Q in FIG. 1 provided by an example.
Figure 3:
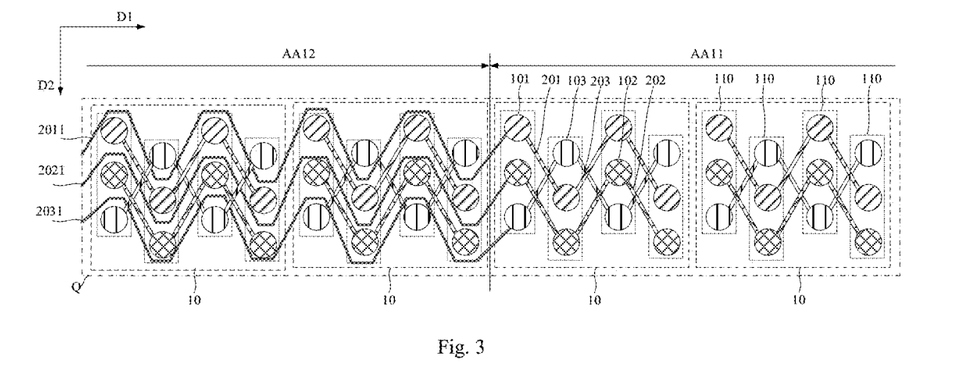
FIG. 3 shows a partial enlarged view of the region Q in FIG. 1 provided by another example.
Figure 4:
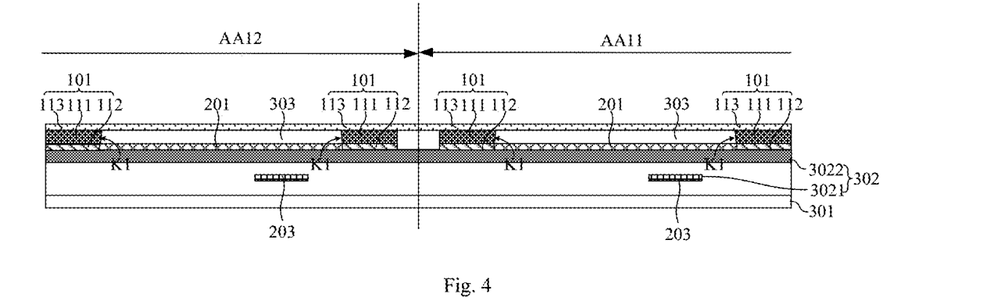
FIG. 4 shows a cross-section view in the B-B direction in FIG. 2 provided by a first example.
Figure 7:
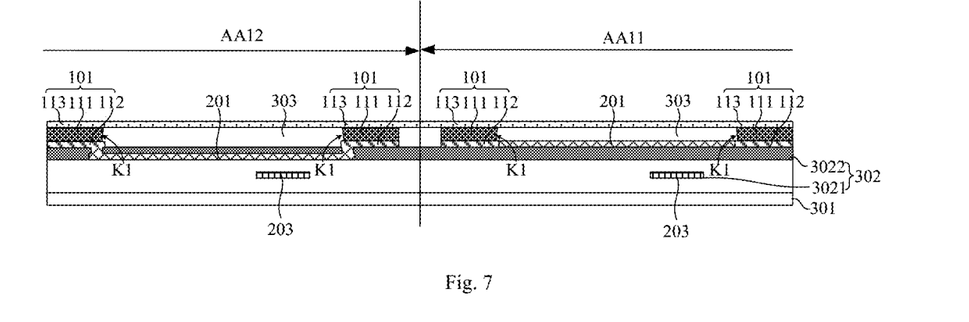
FIG. 7 shows a cross-section view in the B-B direction in FIG. 2 provided by a fourth example.

FIG. 1 shows a schematic top view of a display panel according to an embodiment of the application, and FIG. 2 shows a partial enlarged view of the region Q in FIG. 1 provided by an example. FIG. 3 shows a partial enlarged view of the region Q in FIG. 1 provided by another example. FIG. 4 FIG. 7 shows a cross-section view in the B-B direction in FIG. 2 provided by a fourth example.

As shown in FIG. 1, the display panel 100 has a first display area AA1, a second display area AA2, and a non-display area NA surrounding the first display area AA1 and the second display area AA2. The light transmittance of the first display area AA1 is greater than that of the second display area AA2.

Herein preferably, the light transmittance of the first display area AA1 is greater than or equal to 15%. In order to ensure that the light transmittance of the first display area AA1 is greater than 15%, even greater than 40%, or even higher. The light transmittances of the respective functional film layers of the display panel 100 in the embodiment are all greater than 80%, and even at least a portion of the functional film layers have a light transmittance greater than 90%.

In the display panel 100 according to an embodiment of the application, the first display area AA1 has a light transmittance greater than that of the second display area AA2, such that the display panel 100 can be integrated with a photosensitive component on the back side of the first display area AA1 to achieve under-screen integration of a photosensitive component such as a camera while the first display area AA1 can display a picture, thereby improving the display area of the display panel 100 and realizing the full-screen design of the display device.

The first display area AA1 comprises a central region AA11 and an edge region AA12 adjacent to the central region A11. The back side of the first display area AA1 is integrated with a photosensitive component, and the central region AA11 has a requirement on light transmittance higher than that of the edge region AA12. The specific location, shape, and size of the central region AA11 may be set according to the specific position of the photosensitive component.

As shown in FIGS. 2 and 4, the display panel 100 comprises a plurality of repetitive units 10 and each of repetitive units 10 includes at least two pixels 110. Each pixel 110 comprises a plurality of sub-pixels 101, 102, 103 of at least three colors. Each of the sub-pixels 101, 102, 103 comprises a first electrode 112, a light-emitting structure 111 and a second electrode 113 which are stacked in sequence.

In the first display area AA1, the first electrodes 112 of adjacent sub-pixels 101, 102, 103 of an identical color in a repetitive unit 10 are electrically connected via interconnection structures 201, 202, 203, so that said adjacent sub-pixels of the identical color in the repetitive unit form at least three pixel groups 01, 02, 03 and all the sub-pixels in any one of the at least three pixel groups is in a same color. For example, FIG. 2 shows that the pixel group 01 comprises four sub-pixels 101 in a first color and three interconnection structures 201, the pixel group 02 comprises four sub-pixels 102 in a second color and three interconnection structures 202, and the pixel group 03 comprises four sub-pixels 103 in a third color and three interconnection structures 203. As such, the sub-pixels interconnected with the first electrode 112 form a pixel combination structure. The sub-pixels of the pixel group in one color may be electrically connected to one pixel circuit, such that the display of the sub-pixels of the pixel combination structure is controlled by one pixel circuit, further reducing the actual PPI of the first display area AA1, reducing drive wiring in the first display area AA1 and improving the light transmittance thereof.

Further, in the central region AA11, the interconnection structure of at least one of the three pixel groups is a transparent conductive structure, such that the light transmittance of the central region AA11 can be further improved.

The transparent conductive structures may be made of ITO.

The display panel comprises a substrate 301 on which the pixels 110 are arranged. The pixel 110 comprises sub-pixels in three colors which are a sub-pixel of a first color 101, a sub-pixel of a second color 102 and a sub-pixel of a third color 103, respectively. Correspondingly, the pixel groups comprise a first pixel group in the first color 01, a second pixel group in the second color 02, and a third pixel group in the third color 03.

The orthographic projection of the interconnection structures 201 of the first pixel group 01 on the substrate 301 is staggered with that of the interconnection structures 202 of the second pixel group 02 on the substrate 301. Further, the orthographic projection of the interconnection structures of the third pixel group 03 on the substrate 301 is staggered with those of both the interconnection structures 201 of the first pixel group 01 and the interconnection structures 202 of the second pixel group 02 on the substrate 301. Alternatively, the orthographic projection of the interconnection structures 201 of the first pixel group 01 on the substrate 301 is staggered with that of the interconnection structures 202 of the second pixel group 02 on the substrate 301. Furthermore, the orthographic projection of one of the interconnection structures 201 of the first pixel group 01 and the interconnection structures 202 of the second pixel group 02 on the substrate 301 is staggered with that of the interconnection structures 301 of the third pixel group 03.

The orthographic projections of the interconnection structures of two of the three pixel groups on the substrate are staggered with each other. As such, the interconnection structures of two pixel groups may be arranged in the same layer, and these interconnection structures may be formed in the same process step, such that the complexity of the manufacturing process may be reduced. Furthermore, interconnection structures with staggered orthographic projections on the substrate can be arranged in different layers, which can avoid interfering with the normal operation of the pixel groups when the interconnection structures with staggered orthographic projections on the substrate are arranged in the same layer.

Referring to FIGS. 2, 4 to 7, in the central region AA11, the interconnection structure of at least one of the three pixel groups is a transparent conductive structure, and the interconnection structures of the central region AA11 and the edge region AA12 may comprise at least the following arrangement.

In some embodiments, the interconnection structures of the central region AA11 may be arranged in at least two ways.

First Arrangement Mode:

In the central region AA11, the interconnection structures 201 of the first pixel group 01 and the interconnection structures 202 of the second pixel group 02 are transparent conductive structures arranged in the same layer as the first electrodes 112. The interconnection structures 203 of the third pixel group 03 are in a different layer from the interconnection structures 201 of the first pixel group 01 and the interconnection structures 202 of the second pixel group 02.

Second Arrangement Mode:

In the central region AA11, the interconnection structures 201 of the first pixel group 01 and the interconnection structures 202 of the second pixel group 02 are transparent conductive structures arranged under the first electrodes 112, and the interconnection structures 203 of the third pixel group 03 is in a different layer from the interconnection structures 201 of the first pixel group 01 and the interconnection structures 202 of the second pixel group 02. For example, the interconnection structures 201 of the first pixel group 01 and the interconnection structures 202 of the second pixel group 02 are the same layer or different layers arranged under the first electrodes 112.

In some embodiments, the interconnection structures of the edge region AA12 may be arranged at least in the following two ways.

First Arrangement Mode:

In the edge region AA12, the interconnection structures 201 of the first pixel group 01 and the interconnection structures 202 of the second pixel group 02 are arranged in the same layer as the first electrodes 112. The interconnection structures 203 of the third pixel group 03 are arranged in a different layer from the interconnection structures 201 of the first pixel group 01 and the interconnection structures 202 of the second pixel group 02.

Optionally, in the edge region AA12, when the interconnection structures 201 of the first pixel group 01 and the interconnection structures 202 of the second pixel group 02 are arranged in the same layer as the first electrodes 112, the material of the interconnection structures 201 of the first pixel group 01 and the interconnection structures 202 of the second pixel group 02 may be identical to or different from that of the first electrodes 112, or may be transparent conductive structures.

Second Arrangement Mode:

In the edge region AA12, the interconnection structures 201 of the first pixel group 01 and the interconnection structures 202 of the second pixel group 02 are transparent conductive structures arranged under the first electrodes 112. The interconnection structures 203 of the third pixel group 03 are arranged in a different layer from the interconnection structures 201 of the first pixel group 01 and the interconnection structures 202 of the second pixel group 02. For example, the interconnection structures 201 of the first pixel group 01 and the interconnection structures 202 of the second pixel group 02 may be the same layer or different layers arranged under the first electrodes 112.

In some embodiments, each of the pixel groups of the first display area AA1 is connected to a corresponding pixel circuit via a lead traversing the edge region. The lead may be a transparent conductive structure such as ITO (Indium Tin Oxides). As shown in FIG. 3, the first pixel group 01 is connected to the corresponding pixel circuit (not shown in the figure) via a lead 2011, the second pixel group 02 is connected to the corresponding pixel circuit via a lead 2021, and the third pixel group 03 is connected to the corresponding pixel circuit via a lead 2031. The pixel circuits control the display of each sub-pixel of the pixel groups via the corresponding leads. For example, the leads 2011, 2021, and 2031 are all transparent conductive structures to improve the light transmittance of the first display area AA1. In the edge region, orthographic projections of the leads on the substrate are staggered with orthographic projections of the sub-pixels on the substrate.

Either of the two arrangement modes for the central region AA11 or either of the two arrangement modes for the edge region AA12 may be selected, or the two arrangement modes for the central region AA11 and the two arrangement modes for the edge region AA12 may be combined arbitrarily. For example, the two arrangement modes for the central region AA11 and the two arrangement modes for the edge region AA12 are combined as follows.

First Type of Combination:

In some embodiments, the pixel density of the first display area AA1 is relatively small, for example, 100 PPI, or less, and the distance between the sub-pixels is relatively large, such that there is enough space to arrange the leads. As shown in FIG. 4, a first arrangement mode for the central region AA11 and a first arrangement mode for the edge region AA12 are adopted. Now, the material of the interconnection structures 201 of the first pixel group 01 and of the interconnection structures 202 of the second pixel group 02 may be the same as or different from the first electrodes 112, or may be of transparent conductive structure.

In some embodiments, the same arrangement mode is adopted for the central region AA11 and the edge region AA12, i.e., the first type of combination is adopted for the central region AA11 and the edge region AA12. The leads 2011, 2021 corresponding to the first pixel group 01 and the second pixel group 02 of the central region AA11 and the edge region AA12 may be provided as transparent conductive structures in the same layer as the first electrodes 112. Further, the interconnection structures 201 of the first pixel group 01 and the interconnection structures 202 of the second pixel group 02 in the central region AA11 and the edge region AA12 are all provided as transparent conductive structures. As such, the interconnection structures 201, 202 of the entire first display area AA1 and the leads 2011, 2021 can be formed in the same process step, such that the complexity of the manufacturing process can be reduced. In addition, the light transmittance of the overall first display area AA1 can be improved.

In some embodiments, the lead 2031 corresponding to the third pixel group 03 in the central region AA11 and the edge region AA12 may be provided as a transparent conductive structure in the same layer as the first electrodes 112, or the lead 2031 corresponding to the third pixel group 03 in the central region AA11 and the edge region AA12 may be provided as a transparent conductive structure in the same layer as the interconnection structures 203 of the third pixel group 03.

Figure 5:
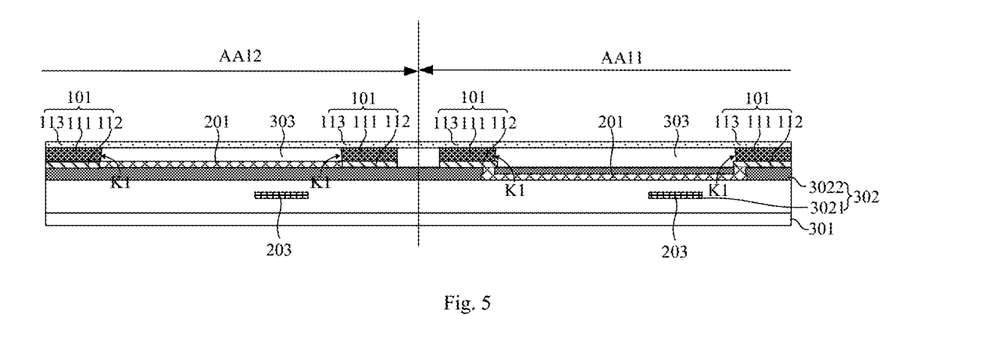
FIG. 5 shows a cross-section view in the B-B direction in FIG. 2 provided by a second example.

Second Type of Combination:

In some embodiments, the pixel density of the first display area AA1 is relatively large, for example, 100 PPI, and the distance between the sub-pixels is relatively small, such that there is not enough space to arrange the leads. As shown in FIG. 5, the second arrangement mode for the central region AA11 and the first arrangement mode for the edge region AA12 are adopted. Now, the material of the interconnection structures 201 of the first pixel group 01 and of the interconnection structures 202 of the second pixel group 02 may be the same as or different from the first electrodes 112, or may be of transparent conductive structure.

The central region AA11 and the edge region AA12 are arranged in different ways, and the interconnection structures 201, 202 of the edge region AA12 are arranged in the same layer as the first electrodes 112, such that sufficient space can be left underneath the first electrodes 112 of the edge region AA12 to arrange the leads.

In some embodiments, the interconnection structures 201 of the first pixel group 01 and of the interconnection structures 202 of the second pixel group 02 of the edge region AA12 are both of the same material as the first electrodes 112, such that the interconnection structures 201, 202 of the edge region AA12 and the first electrodes 112 may be formed in the same process step to reduce the complexity of the manufacturing process.

In some embodiments, the leads 2011, 2021 corresponding to the first pixel group 01 and the second pixel group 02 in the central region AA11 are transparent conductive structures arranged in the same layer as the interconnection structures 201 of the first pixel group 01 and the interconnection structures 202 of the second pixel group 02 in the central region AA11. That is, the interconnection structures 201, 202 of the central region AA11 and the corresponding leads 2011, 2021 are all arranged in the same layer under the first electrodes 112, and are all transparent conductive structures, and the interconnection structures 201, 202 of the central region AA11 and the leads 2011, 2021 may be formed in the same process step, such that the complexity of the manufacturing process may be reduced.

Figure 6:
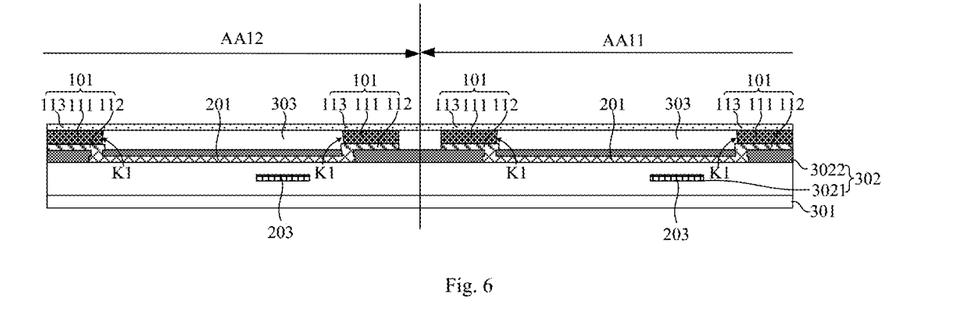
FIG. 6 shows a cross-section view in the B-B direction in FIG. 2 provided by a third example.

Third Type of Combination:

In some embodiments, the pixel density of the first display area AA1 is relatively small, for example, 100 PPI, or less, and the distance between the sub-pixels is relatively large, such that there is enough space to arrange the leads. As shown in FIG. 6, the second arrangement mode for the central region AA11 and the second arrangement mode for the edge region AA12 are adopted.

As such, the interconnection structures 201, 202 of the central region AA11 and the edge region AA12 are all located under the first electrodes 112. Preferably, the interconnection structures 201 of the first pixel group 01 and the interconnection structures 202 of the second pixel group 02 of the central region AA11 is located in the same layer under the first electrodes 112 as the interconnection structures 201 of the first pixel group 01 and the interconnection structures 202 of the second pixel group 02 of the edge region AA12.

In some embodiment, the leads 2011, 2021 corresponding to the first pixel group 01 and the second pixel group 02 in the central region AA11 are transparent conductive structures arranged in the same layer as the interconnection structures 201 of the first pixel group 01 and the interconnection structures 202 of the second pixel group 02 in the central region AA11. In some embodiments, the leads 2011, 2021 corresponding to the first pixel group 01 and the second pixel group 02 in the edge region AA12 are transparent conductive structures arranged in the same layer as the interconnection structures 201 of the first pixel group 01 and the interconnection structures 202 of the second pixel group 02 in the edge region AA12.

In some embodiments, the interconnection structures 201 of the first pixel group 01, the corresponding leads 2011 thereof, and the interconnection structures 202 of the second pixel group 02, the corresponding leads 2021 in the central region AA11 and the edge region AA12 are all provided as transparent conductive structures located in the same layer. As such, the interconnection structures 201, 202 of the entire first display area AA1 and the leads 2011, 2021 can be formed in the same process step, such that the complexity of the manufacturing process can be reduced. In addition, the light transmittance of the entire first display area AA1 can be improved.

Fourth Type of Combination:

In some embodiments, the pixel density of the first display area AA1 is relatively large, for example, 100 PPI, and the distance between the sub-pixels is relatively small, such that there is not enough space to arrange the leads. As shown in FIG. 7, the first arrangement mode for the central region AA11 and the second arrangement mode for the edge region AA12 are adopted.

The central region AA11 and the edge region AA12 are arranged in different ways, and the interconnection structures 201, 202 of the edge region AA12 are arranged under the first electrodes 112, such that sufficient space can be left on the layer in which the first electrodes 112 of the edge region AA12 are located to arrange the leads.

Further, the interconnection structures 201 of the first pixel group 01 and the interconnection structures 202 of the second pixel group 02 in the edge region AA12 are both provided as transparent conductive structures, so as to improve the light transmittance of the overall first display area AA1.

In some embodiments, the leads 2011, 2021 corresponding to the first pixel group 01 and the second pixel group 02 in the central region AA11 are transparent conductive structures arranged in the same layer as the first electrodes 112. The interconnection structures 201, 202 of the central region AA11 and the corresponding leads 2011, 2021 are in the same layer as the first electrodes 112, and may be formed in the same process step, such that the complexity of the manufacturing process may be reduced.

In some embodiments, the leads 2011, 2021 corresponding to both the first pixel group 01 and the second pixel group 02 in the edge region AA12 are transparent conductive structures arranged in the same layer as the interconnection structures 201 of the first pixel group 01 and the interconnection structures 202 of the second pixel group 02 in the edge region AA12. As such, the interconnection structures 201, 202 of the edge region AA12 and the corresponding leads 2011, 2021 can be formed in the same process step, such that the complexity of the manufacturing process can be reduced.

As shown in FIGS. 4 to 7, the display panel comprises a substrate 301, a component layer 302, and a pixel definition layer 303. The component layer 302 is located on the substrate 301 and the pixel definition layer 303 is located on the component layer 302. A pixel circuit corresponding to each sub-pixel of the first display area AA1 is located in the component layer 302 of the second display area A. The component layer 302 comprises a planarization layer 3022 and at least one metal layer 3021 located between the planarization layer 301 and the substrate 301.

One of the at least one metal layer 3021 is the interconnection structure 203 of the third pixel group 03 in the central region AA11 and the edge region AA12. The interconnection structure 203 of the third pixel group 03 is electrically connected to the corresponding first electrodes 112 via a via hole. The metal layer 3021 may be an upper polar plate of a capacitor. It is only required to form the via hole structure in the manufacturing process to connect the corresponding first electrode and the upper polar plate, so as to form the interconnection structure 203 of the third pixel group 03, such that the manufacturing process is simplified.

The interconnection structures 201, 202 of the central region AA11 and/or the edge region AA12 may be arranged on top of the planarization layer 3022 when being arranged in the same layer as the first electrodes 112. When the interconnection structures 201, 202 of the central region AA11 and/or the edge region AA12 are located under the first electrodes 112, they may be located under the planarization layer 3022. The interconnection structures 201, 202 are electrically connected to the corresponding first electrodes 112 via the via holes when they are located under the first electrodes 112.

The second display area AA2 comprises a first sub-display area AA21 and a second sub-display area AA22 adjoining the first sub-display area AA21 and the second sub-display area AA22 of the first display area AA1, and the pixel circuit corresponding to the sub-pixels of the first display area AA1 is arranged in the second sub-display area AA22. It is to be appreciated that there may be more than one pixel circuit corresponding to the sub-pixels of the first display area AA1, which are electrically connected to the corresponding pixel groups respectively.

The circuit structure of the pixel circuit comprises any one of: one thin film transistor, two thin film transistors and one capacitor, three thin film transistors and one capacitor, six thin film transistors and one capacitor, six thin films transistors and two capacitors, seven thin film transistors and one capacitor, seven thin film transistors and two capacitors, or nine thin film transistors and one capacitor. Herein the circuit structure of the pixel circuit comprises two thin film transistors (T) and one capacitor (C), which means that the circuit structure of the pixel circuit is a "2T1C circuit", and the remaining "7T1C circuit", "7T2C circuit", "9T1C circuit", and so on in a similar way.

In the display panel 100 according to the embodiment of the application, the pixel circuit for driving each sub-pixel of the pixel group to display is located in the second sub-display area AA22, thereby reducing the wiring structure in the first display area AA1 and increasing the light transmittance of the first display area AA1.

At least two pixels 110 of the repetitive unit 10 are alternately distributed in a first direction D1, and the sub-pixels of two adjacent pixels 110 are arranged in a second direction D2 and are staggered with each other in the first direction D1. The first direction D1 intersects with the second direction D2. Preferably, the first direction D1 is perpendicular to the second direction D2. The first direction D1 may be a row direction or a column direction, and the corresponding second direction D2 may be the column direction or the row direction.

The sub-pixels of two adjacent pixels 110 are arranged in the second direction D2 in a different color order. For example, as shown in FIG. 2, the repetitive unit 10 comprises four pixels 110, each pixel 110 including sub-pixels of three colors. Taking one repetitive unit 10 as an example, the color order of each sub-pixel of the first pixel 110 on the left arranged in the second direction D2 may be red, green, and blue sub-pixels. The color order of each sub-pixel of the second pixel 110 on the left in the second direction D2 may be blue, red, and green sub-pixels. The color order of each sub-pixel of the first pixel 110 on the right arranged in the second direction D2 is the same as that of the second pixel 110 on the left, and the color order of each sub-pixel of the second pixel 110 on the right in the second direction D2 is the same as that of the first pixel 110 on the left.

As such, the colors of the sub-pixels adjacent in the second direction in the first display area AA1 are all different and the distribution of the sub-pixels of an identical color is more uniform, such that the problem that a plurality of sub-pixels of an identical color in a certain area of the first display area AA1 are adjacent to each other can be avoided, which leads to non-uniform color distribution during the display of the first display area AA1. The display effect of the first display area AA1 can be improved.

The substrate 301 may be made of a light-transmissive material such as glass or polyimide (PI). The component layer 302 of the second display area AA2 may comprise a pixel circuit for driving each sub-pixel display. The pixel definition layer 303 comprises a first pixel opening K1 located in the first display area AA1. In some embodiments, the pixel definition layer 303 comprises a second pixel opening located in the second display area AA2.

Each of the sub-pixels 101, 102, 103 comprises a light-emitting structure 111, a first electrode 112 and a second electrode 113. The light-emitting structures 111 of the first display area AA1 are located in the first pixel opening K1, the first electrodes 112 are located on a side of the light emission structure 111 facing towards the substrate 301, and the second electrodes 113 are located on a side of the light emission structure 111 facing away from the substrate 310.

One of the first electrode 112 and the second electrode 113 is an anode, and the other is a cathode. In the embodiment, it is described taking the first electrode 112 as the anode and the second electrode 113 as the cathode as an example.

The light-emitting structure 111 may comprise an OLED light-emitting layer, and may further comprise at least one of a hole injection layer, a hole transport layer, an electron injection layer or an electron transport layer according to design requirements of the light-emitting structure 111.

The first electrode 112 is a transparent electrode. In some embodiments, the first electrode 112 comprises an indium tin oxide (ITO) layer or an indium zinc oxide layer. In some embodiments, the first electrode 112 is a reflective electrode including a first transparent conductive layer, a reflective layer on the first transparent conductive layer, and a second transparent conductive layer on the reflective layer. The first and second transparent conductive layers may be made of ITO, indium zinc oxide or the like, and the reflective layer may a metal layer, for example, made of silver.

The second electrode 113 comprises a magnesium-silver alloy layer. In some embodiments, the second electrodes 113 may be interconnected as a common electrode.

The orthographic projection of each light-emitting structure 111 of the first display area AA1 on the substrate 301 is composed of one first graphic unit or composed of two or more first graphic units spliced together. The first graphic element comprises at least one selected from the group consisting of a circle, an oval, a dumbbell, a calabash, and a rectangle.

The orthographic projection of each first electrode 112 of the first display area AA1 on the substrate 301 is composed of one second graphic unit or composed of two or more second graphic units spliced together. The second graphic unit comprises at least one selected from the group consisting of a circle, an oval, a dumbbell, a calabash, and a rectangle.

The above shapes can change the periodic structure formed by diffraction, that is, change the distribution of the diffraction field, thereby reducing the diffraction effect of externally incident light upon passing through the first display area AA1. Therefore, it is ensured that the image captured by the camera under the first display area AA1 has a high definition.

For example, the display panel 100 may further comprise an encapsulation layer and a polarizer and a cover plate located over the encapsulation layer, or a cover plate may be arranged directly over the encapsulation layer without a polarizer, or at least a cover plate is arranged directly over the encapsulation layer of the first display area AA1 without a polarizer, so as to prevent the polarizer from affecting the light collection amount of the photosensitive element arranged correspondingly under the first display area AA1. Of course, a polarizer may also be arranged above the encapsulation layer of the first display area AA1.

Embodiments of the application also provide a display device, which may comprise the display panel 100 of any of the embodiments described above. Hereinafter, a display device of an embodiment, in which the display device comprises the display panel 100 of the above-described embodiments, will be described as an example.

Figure 8:
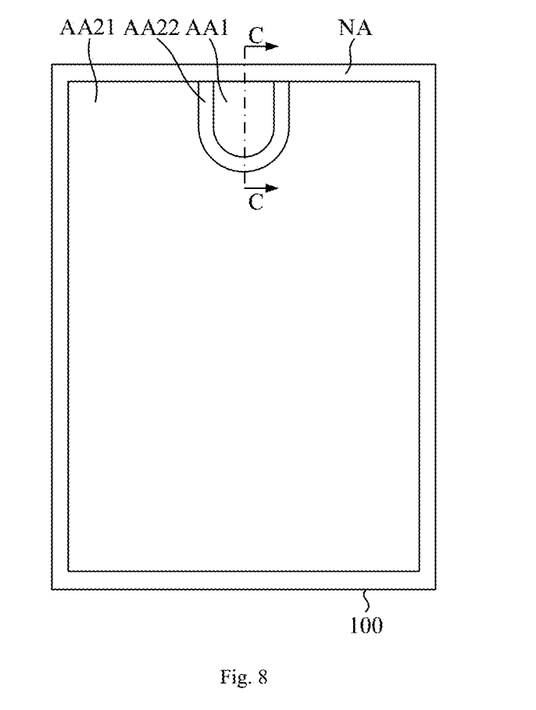
FIG. 8 shows a schematic top view of a display device according to an embodiment of the application.
Figure 9:
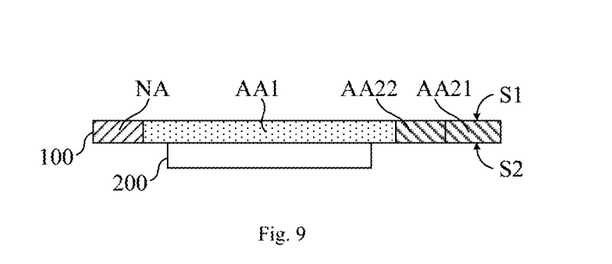
FIG. 9 shows a cross-section view in the C-C direction in FIG. 8 provided by an example.

FIG. 8 shows a schematic top view of a display device provided according to an embodiment of the application. FIG. 9 shows a cross-section view in the C-C direction in FIG. 8 provided by an embodiment. In the display device of the embodiment, the display panel 100 may be one of the embodiments described above. The display panel 100 has a first display area AA1 and a second display area AA2, and the first display area AA1 has a light transmittance greater than that of the second display area AA2.

The display panel 100 comprises a first surface S1 and a second surfaces S2 which are opposite to each other. The first surface S1 is a display surface. The display device further comprises a photosensitive component 200. The photosensitive component 200 is located on the side of the second surface S2 of the display panel 100, and corresponds to the first display area AA1 in location.

The photosensitive component 200 may be an image capture device for capturing external image information. In the embodiment, the photosensitive component 200 is a complementary metal oxide semiconductor (CMOS) image capture device, and in some other embodiments, the photosensitive component 200 may also be a charge-coupled device (CCD) image capture device and image capture devices of other forms. The photosensitive component 200 may not be limited to an image capture device. For example, in some embodiments, the photosensitive component 200 may also be a light sensor such as an infrared sensor, a proximity sensor, an infrared lens, a flood light sensing element, an ambient light sensor, or a dot matrix projector. In addition, the display device may be integrated with other components, such as an earpiece and a speaker, on the second surface S2 of the display panel 100.

In the display device according to the embodiment of the application, the first display area AA1 has a light transmittance greater than that of the second display area AA2, such that the display panel 100 can be integrated with a photosensitive component 200 on the back side of the first display area AA1 to achieve under-screen integration of a photosensitive component such as an image capture device while the first display area AA1 can display a picture, thereby improving the display area of the display panel 100 and realizing the full-screen design of the display device.

In the display panel according to an embodiment of the application, the first electrodes of adjacent sub-pixels of an identical color in the repetitive unit 10 within the first display area AA1 are electrically connected via the interconnection structures in order to form a pixel group. As such, the plurality of pixels comprised in the repetitive unit within the first display area become one pixel, such that the actual pixel density PPI (Pixels Per Inch) of the first display area AA1 can be reduced. Wherein the sub-pixels of the pixel group in the repetitive unit only need to be connected to one pixel circuit, so as to reduce the number of wirings in the first display area, and facilitate to improve the light transmittance of the first display area AA1.

In the central region AA11 of the first display area AA1, the interconnection structure of at least one the three pixel groups is a transparent conductive structure, which can further improve the light transmittance in the central region AA11 of the first display area AA1 and reduce the impact on the photographic effect.

In accordance with the embodiments of the application as described above, these embodiments are not intended to be exhaustively set forth all the details, nor are they intended to limit the application to the specific embodiments described. It will be apparent that many modifications and variations by a person of ordinary skill in the art are possible from the above description. These embodiments have been chosen and described in detail in the description in order to better explain the principle and practical application of the application, thereby enabling a person skilled in the art to make better use of the application and its modifications. The scope of the application is defined only by the appended claims.

What is claimed is:

1. A display panel having a first display area and a second display area, the first display area comprising a central region and an edge region adjacent to the central region, the first display area having a light transmittance greater than that of the second display area, the display panel comprising:
   a plurality of repetitive units, each of which comprises at least two pixels, each of the pixels comprising a plurality of sub-pixels in at least three colors, each of the sub-pixels comprising a first electrode, a light-emitting structure and a second electrode stacked in sequence;
   in the first display area, the first electrodes of adjacent sub-pixels of an identical color in the repetitive unit are electrically connected via an interconnection structure in order that said adjacent sub-pixels of the identical color in the repetitive unit form at least three pixel groups and all the sub-pixels in one of the at least three pixel groups is in a same color;
   wherein, in the central region, the interconnection structure of at least one of the at least three pixel groups of one color is a transparent conductive structure.

2. The display panel according to claim 1, wherein the sub-pixels are interconnected with the first electrodes to form a pixel combination structure, and the sub-pixels of the at least three pixel groups are electrically connected to one pixel circuit, such that the sub-pixels of the pixel combination structure are controlled by one pixel circuit.

3. The display panel according to claim 1, further comprising a substrate, the pixels are arranged on the substrate; the sub-pixels are of three colors, the at least three pixel groups comprising a first pixel group of a first color, a second pixel group of a second color and a third pixel group of a third color, wherein the orthographic projection of the interconnection structure of the first pixel group on the substrate is staggered with that of the interconnection structure of the second pixel group.

4. The display panel according to claim 3, wherein the orthographic projection of the interconnection structure of the third pixel group on the substrate is intersected with that of the interconnection structure of the first pixel group and/or that of the interconnection structure of the second pixel group.

5. The display panel according to claim 3, wherein in the central region, the interconnection structures of both the first pixel group and of the second pixel group are transparent conductive structures arranged in the same layer as the first electrodes, the interconnection structure of the third pixel group is in a different layer from the interconnection structures of both the first pixel group and the second pixel group;

in the edge region, the interconnection structures of both the first pixel group and the second pixel group are arranged in the same layer as the first electrodes, the interconnection structure of the third pixel group is arranged in a different layer from the interconnection structures of the first pixel group and the second pixel group;

in the edge region, the interconnection structures of the first pixel group and the second pixel group are of the same material as the first electrodes, or the interconnection structures of both the first pixel group and the second pixel group are transparent conductive structures.

6. The display panel according to claim 5, wherein the at least three pixel groups are electrically connected with the corresponding pixel circuits via a plurality of leads traversing the edge region, the leads corresponding to the first pixel group and the second pixel group in the central region and in the edge region are transparent conductive structures arranged in the same layer as the first electrodes, and in the edge region, orthographic projections of the leads on the substrate are staggered with orthographic projections of the sub-pixels on the substrate.

7. The display panel according to claim 4, wherein in the central region, the interconnection structures of the first pixel group and of the second pixel group are transparent conductive structures arranged under the first electrodes, and the interconnection structure of the third pixel group is in a different layer from both the interconnection structure of the first pixel group and the interconnection structure of the second pixel group;

in the edge region, the interconnection structures of the first pixel group and of the second pixel group are arranged in the same layer as the first electrodes, and the interconnection structure of the third pixel group is arranged in a different layer from both the interconnection structure of the first pixel group and the interconnection structure of the second pixel group;

in the edge region, the interconnection structures of the first pixel group and of the second pixel group are of the same material as the first electrodes, or the interconnection structures of both the first pixel group and of the second pixel group are transparent conductive structures.

8. The display panel according to claim 7, wherein the leads corresponding to the first pixel group and the second pixel group in the central region are transparent conductive structures arranged in the same layer as both the interconnection structure of the first pixel group and the interconnection structure of the second pixel group in the central region.

9. The display panel according to claim 3, wherein in the central region, the interconnection structures of the first pixel group and of the second pixel group are transparent conductive structures arranged under the first electrodes, and the interconnection structure of the third pixel group is in a different layer from both the interconnection structure of the first pixel group and the interconnection structure of the second pixel group;

in the edge region, the interconnection structures of the first pixel group and of the second pixel group are transparent conductive structures arranged under the first electrodes, the interconnection structure of the third pixel group is arranged in a different layer from both the interconnection structure of the first pixel group and the interconnection structure of the second pixel group;

both the interconnection structure of the first pixel group and the interconnection structure of the second pixel group in the central region are located in the same layer as both the interconnection structures of the first pixel group and of the second pixel group in the edge region.

10. The display panel according to claim 9, wherein the leads corresponding to the first pixel group and the second pixel group in the central region are transparent conductive structures arranged in the same layer as both the interconnection structure of the first pixel group and the interconnection structure of the second pixel group in the central region.

11. The display panel according to claim 9, wherein the leads corresponding to the first pixel group and the second pixel group in the edge region are transparent conductive structures arranged in the same layer as both the interconnection structure of the first pixel group and the interconnection structure of the second pixel group in the edge region.

12. The display panel according to claim 3, wherein in the central region, the interconnection structures of the first pixel group and of the second pixel group are transparent conductive structures arranged in the same layer as the first electrodes, and the interconnection structure of the third pixel group is in a different layer from both the interconnection structures of the first pixel group and of the second pixel group;

in the edge region, the interconnection structures of the first pixel group and of the second pixel group are transparent conductive structures arranged under the first electrodes, and the interconnection structure of the third pixel group is arranged in a different layer from both the interconnection structure of the first pixel group and the interconnection structure of the second pixel group.

13. The display panel according to claim 12, wherein the leads corresponding to the first pixel group and the second pixel group in the central region are transparent conductive structures arranged in the same layer as the first electrodes.

14. The display panel according to claim 12, wherein the leads corresponding to the first pixel group and the second pixel group in the edge region are transparent conductive structures arranged in the same layer as both the interconnection structure of the first pixel group and the interconnection structure of the second pixel group in the edge region.

15. The display panel according to claim 3, further comprises:
   a component layer located on the substrate and comprising a planarization layer and at least one metal layer located between the substrate and the planarization layer;
   wherein one of the at least one metal layer is the interconnection structure of the third pixel group to be electrically connected to the corresponding first electrodes by a via hole.

16. The display panel according to claim 1, wherein the second display area comprises a first sub-display area and a second sub-display area adjoining the first sub-display area and the first display area, a pixel circuit corresponding to the sub-pixels disposed in the first display area being arranged in the second sub-display area;
   the circuit structure of the pixel circuit corresponding to the sub-pixels in the first display area comprises any one of: one thin film transistor, two thin film transistors and one capacitor, three thin film transistors and one capacitor, six thin film transistors and one capacitor, six thin films transistors and two capacitors, seven thin film transistors and one capacitor, seven thin film transistors and two capacitors, or nine thin film transistors and one capacitor.

17. The display panel according to claim 1, further comprises a substrate on which the pixels are arranged;
   at least two pixels of the repetitive unit are alternately distributed in a first direction, the sub-pixels of two adjacent pixels being arranged in a second direction and being staggered with each other in the first direction.

18. The display panel according to claim 1, wherein the orthographic projection of the light-emitting structures of the first display area on the substrate is composed of one first graphic unit or composed of two or more first graphic units spliced together, the first graphic unit comprising at least one selected from the group consisting of a circle, an oval, a dumbbell, a calabash, and a rectangle.

19. The display panel according to claim 1, wherein the orthographic projection of the first electrodes of the first display area on the substrate is composed of one second graphic unit or composed of two or more second graphic units spliced together, the second graphic unit comprising at least one selected from the group consisting of a circle, an oval, a dumbbell, a calabash, and a rectangle.

20. The display panel according to claim 1, wherein the first electrodes of the first display area are light-transmissive electrodes; or the first electrodes of the first display area are reflective electrodes; or the first electrodes of the first display area comprise a indium tin oxide layer or an indium zinc oxide layer,
   and/or, the second electrodes of the first display area comprise a magnesium-silver alloy layer.

* * * * *